(12) United States Patent
Rhodes

(10) Patent No.: US 7,161,434 B2
(45) Date of Patent: Jan. 9, 2007

(54) AMPLIFIER

(75) Inventor: John David Rhodes, Ilkley (GB)

(73) Assignee: Filtronic PLC (GB)

( * ) Notice: Subject to any disclaimer, the term of this patent is extended or adjusted under 35 U.S.C. 154(b) by 84 days.

(21) Appl. No.: 10/495,815

(22) PCT Filed: Oct. 28, 2002

(86) PCT No.: PCT/GB02/04870

§ 371 (c)(1),
(2), (4) Date: Jan. 3, 2005

(87) PCT Pub. No.: WO03/043181

PCT Pub. Date: May 22, 2003

(65) Prior Publication Data

US 2005/0110576 A1  May 26, 2005

(30) Foreign Application Priority Data

Nov. 15, 2001 (GB) .................................. 0127457.0

(51) Int. Cl.
*H03F 3/04* (2006.01)

(52) U.S. Cl. ...................................... 330/302; 330/306

(58) Field of Classification Search ................ None
See application file for complete search history.

(56) References Cited

U.S. PATENT DOCUMENTS

| 5,146,178 | A |  | 9/1992 | Nojima et al. ............... 330/251 |
| 5,361,403 | A |  | 11/1994 | Dent ........................... 455/74 |
| 6,177,841 | B1 | * | 1/2001 | Ohta et al. .................. 330/302 |
| 6,577,199 | B1 | * | 6/2003 | Dent ........................... 330/302 |

(Continued)

FOREIGN PATENT DOCUMENTS

WO    WO 02/47256 A2    6/2002

OTHER PUBLICATIONS

K. Honjo, "A simple circuit synthesis method for microwave class-F ultra-high-efficiency amplifiers with reactance-compensation circuits", Solid State Electronics, Elsevier Science Publishers, 2000.

(Continued)

*Primary Examiner*—Robert Pascal
*Assistant Examiner*—Alan Wong
(74) *Attorney, Agent, or Firm*—LaRiviere, Grubman & Payne, LLP

(57) ABSTRACT

An amplifier comprising a field effect transistor, a terminating network comprising inductors connected in series separated by capacitors connected in parallel, a filter and a load, wherein the values of the capacitors and inductors are arranged to present open circuits to a predetermined number of odd harmonics of a signal frequency being amplified, and to present short circuits to a predetermined number of even harmonics of the signal frequency, wherein the normalised values of the inductors and capacitors of the terminating network are selected using the following procedure: Let $g_r = C_r$, $r$ odd $= L_r$, $r$ even then $g_1 = 1$, $g_1 g_2 = $(a); $g_r g_{r+1} = $(b), $r = 2 \to 2m-1$ and $g_{2m} g_{2m+1} = $(c) where (m−1) represents the predetermined number of odd harmonics which are presented with an open circuit $$\frac{1}{m(2m-1)} \quad (a)$$

$$\frac{4}{(2m-1+r)(2m-r)} \quad (b)$$

$$\frac{1}{m}. \quad (c)$$

33 Claims, 11 Drawing Sheets

U.S. PATENT DOCUMENTS 6,608,536 B1 * 8/2003 Fallahi ...................... 333/168

OTHER PUBLICATIONS

S. Dietsche "L'optimisation des amplificateurs de puissance á excitation d'entrée sinusoïdale en vue de leur rendement électrique et de leur linéarité", Universite de Paris-Sud, 1995, pp. 19-36, 50-63, 75-90 and 103-104.

Steve C. Cripps, RF Power Amplifiers for Wireless Communications, 1999, pp. 126-127, Artech House, Inc., Norwood, MA.

* cited by examiner

AMPLIFIER

The present invention relates to an amplifier.

Amplifiers, and especially power amplifiers are commonly constructed using a transistor. Referring to FIG. 1, a field effect transistor may be thought of as a channel of variable width which connects a source to a drain. A gate is provided between the source and the drain, charge being supplied to the gate (the gate is electrically effectively a non-linear capacitor). When charge is supplied to the gate, the accumulated charge produces an electric field which extends from the gate, thereby establishing control over current that flows between the source and the drain. Supplying a small negative charge to the gate will allow a small current to flow between the source and the drain, whereas supplying a more positive charge will allow a larger current to flow between the source and the drain.

The relationship between the charge supplied to the gate and the current which flows to the drain is non-linear. This non-linearity causes problems in circuit design, and circuit designers commonly attempt to control the operation of the transistor by providing a 'terminating network' after the transistor.

It is common to attempt to control the effects of nonlinearities generated by a transistor such that a half wave rectified sin wave current, and a approximation to a square wave voltage are present in the transistor, in order to maximise amplifier efficiency. An approximation to a square wave voltage is used because a true square wave cannot be obtained due to the residual output capacitance of the transistor. For a given fundamental signal frequency, the approximated square wave voltage is generated by presenting short circuits to even harmonics of the fundamental and presenting open circuits to odd harmonics of the fundamental. The half wave rectified sine wave current is generated from even harmonics of the fundamental, which are generated by the same short circuits and open circuits. The current and voltage waveforms are arranged so that their overlap is minimal. Power will only be dissipated in the transistor when there is overlap between the current and voltage. If overlap between current and voltage is avoided completely, then in theory this should provide 100% efficiency. However, the presence of resistive and reactive elements in the transistor and the terminating network means that 100% efficiency cannot be achieved, since there is always some overlap between the current and voltage waveforms.

Usually the terminating network comprises a combination of circuit elements having values which are estimated using numerical techniques to correct the transistor output to a reasonably linear output and to provide optimum efficiency. A problem associated with this approach is that the numerical techniques do not necessarily provide an optimum solution. In addition the numerical techniques suffer from the disadvantage that they are based upon approximations which do not hold true for optimum operation of the transistor, and consequently provide a terminating network which gives an output which has a compromised efficiency.

It is an object of the present invention to provide a method of providing an amplifier which overcomes the above disadvantages.

According to a first aspect of the invention there is provided an amplifier comprising a field effect transistor with output capacitance $C_1$ a terminating network comprising inductors connected in series separated by capacitors connected in parallel, a filter and a load, wherein the values of the capacitors and inductors are arranged to present open circuits to a predetermined number of odd harmonics of a signal frequency being amplified, and to present short circuits to a predetermined number of even harmonics of the signal frequency, wherein the normalised values of the inductors and capacitors of the terminating network are selected using the following procedure:

Let $g_r = C_r$ $r$ odd $\quad\quad = L_r$ $r$ even then $$g_1 = 1, \quad g_1 g_2 = \frac{1}{m(2m-1)}$$

$$g_r g_{r+1} = \frac{4}{(2m-1+r)(2m-r)} \quad r = 2 \to 2m-1$$

and $$g_{2m} g_{2m+1} = \frac{1}{m}$$

where (m−1) represents the predetermined number of odd harmonics which are presented with an open circuit.

It will be appreciated that the term 'open circuit' is not intended to mean a perfect open circuit, but rather to mean close enough to being an open circuit to allow the amplifier to function correctly. Similarly, the term 'short circuit' is not intended to mean a perfect short circuit. The term 'normalised' is intended to mean normalised with respect to the drain source capacitance of the field effect transistor (related to the frequency of operation) and with respect to the operating impedance level (related to the required output impedance, e.g. 50 ohms).

According to a second aspect of the invention there is provided an amplifier comprising a field effect transistor and a terminating network, the terminating network being configured to present open circuits to (m−1) odd harmonics of a signal to be amplified, the terminating network further being configured to allow the field effect transistor to operate at an optimum efficiency such that the drain source voltage of the field effect transistor includes peaks located at the following phases:

$$\theta_r = \frac{r\pi}{(m+1)} \quad r = 1 \to m.$$

$\theta$=0, $\pi$ corresponds to the drain source voltage being at the DC bias point.

A specific embodiment of the invention will now be described by way of example only with reference to the accompanying figures, in which.

Figure 1:
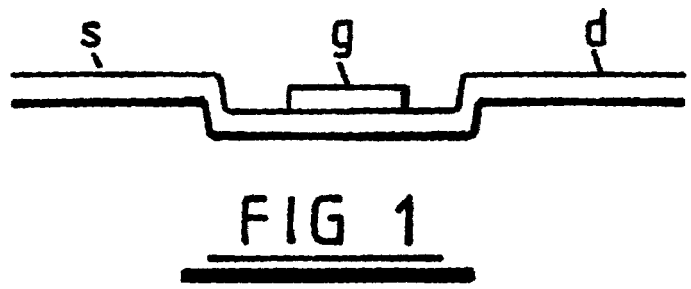
FIG. 1 is a schematic illustration of a conventional transistor.

A field effect transistor comprises a source and a drain separated by a gate, as shown in FIG. 1. The gate controls the flow of current from the source to the drain. When charge is supplied to the gate an electric field extends from the gate into semiconductor located beneath the gate, thereby controlling a channel through which current flows from the source to the drain. The amount of current that flows from the source to the drain is a nonlinear function of the charge on the gate.

Figure 2:
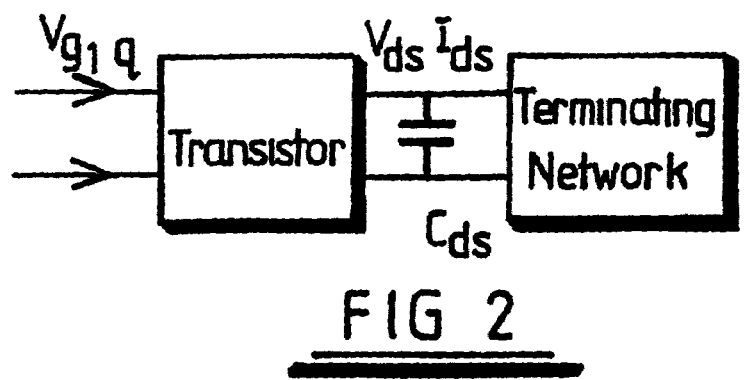
FIG. 2 is a schematic illustration of a transistor and a terminating network.

The invention maximises the efficiency of operation of the field effect transistor (referred to hereafter simply as the 'transistor') and provides a terminating network which optimises the output of the transistor. A transistor and terminating network is shown schematically in FIG. 2. The input to the transistor is shown as being a combination of charge and voltage. The charge provided to the gate is of primary importance since it is the charge supplied to the gate, and not the voltage directly at the gate, that is the physical property that controls the flow of current between the source and the drain.

In a theoretical high efficiency amplifier construction, current and voltage are switched on and off and are arranged so that they never overlap temporally. Since there is no overlap between current and voltage in the transistor, no power is dissipated by the transistor, and the transistor operates at 100% efficiency. However, the transistor and components of the terminating network include resistive and reactive elements, and it is not possible to provide a terminating network which allows the transistor to operate with 100% efficiency. In other words, there is always an unavoidable overlap between current and voltage which will lead to a reduction of efficiency. For example the maximum efficiency that can be provided by a Class B amplifier is $\pi/4$. The invention allows an amplifier to be constructed which provides the maximum achievable efficiency for a given harmonic termination.

Figure 3:
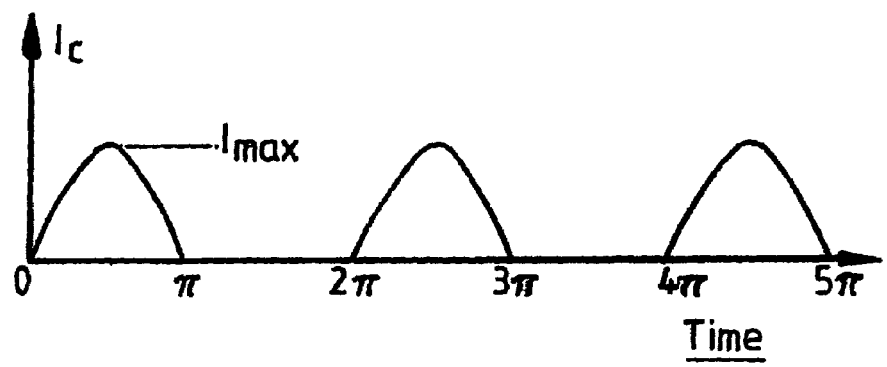
FIG. 3 is a half wave rectified sine wave.

The invention avoids the use of numerical and empirical techniques based upon a set of approximations, as is done in the prior art. Instead the invention is based upon a theoretical analysis of the transistor and the terminating network which includes only one assumption, i.e. that the drain current has the form of a half wave rectified sine wave (FIG. 3). Although in practice the current may not be exactly of this form, it is possible to keep the current close to this form, so that the assumption holds true to a sufficient extent to allow the theory to be implemented in practice.

The voltage waveform is an approximation to a square wave which is generated by adding together odd harmonics of a signal. It is not possible to obtain a perfect square wave of voltage because there is a capacitance between the drain and source of the transistor. This capacitance is found in all transistors and is unavoidable. The invention takes account of this capacitance by including it as part of the terminating network, for example see $C_{ds}$ in FIG. 2. The capacitance between the drain and the source is fairly linear, and so can be modelled as a conventional capacitor.

It is a common misconception that the drain source capacitance of the transistor limits the upper frequency of operation of the transistor. This is incorrect. In fact, the drain source capacitance limits the bandwidth over which the transistor will work (a different concept entirely).

Figure 4:
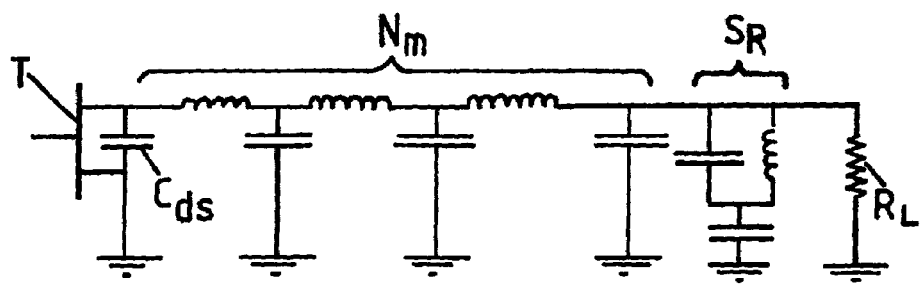
FIG. 4 is a circuit diagram showing an amplifier which embodies the invention (m=3, defined below)

An amplifier constructed according to the invention is shown schematically in FIG. 4. The amplifier comprises a transistor T and associated drain source capacitance $C_{ds}$, and a terminating network comprising a matching network $N_M$ comprising inductors and capacitors arranged to short circuit even harmonics of a signal and to open circuit odd harmonics of the signal, a shunt resonator $S_R$ arranged to transmit the signal without harmonics, and a load $R_L$. The term matching network is intended to mean the set of inductors and capacitors $N_M$, whereas terminating network is intended to mean the matching network together with the shunt resonator $S_R$ and the load $R_L$. It is known from the prior art to construct an amplifier circuit of the type shown in FIG. 4. The invention allows precise determination of the values of the inductors and capacitors of the network $N_M$, and of the load $R_L$.

Prior art terminating networks based upon circuits of the form shown in FIG. 4 have attempted to generate odd signal harmonics at fixed amplitudes, the amplitudes being selected such that the odd harmonics add together to provide a square wave form. Numerical techniques are used to estimate values of the inductors, capacitors and load which will provide the harmonics at the required amplitudes. The inventor has realised that this approach is entirely wrong, and that provided that the transistor is operating at the correct operating point (i.e. the correct amplitude of the fundamental signal is present in the transistor), the terminating network does not need to dictate the amplitudes of the odd harmonics of the signal. The amplitudes of the odd harmonics of signal will find their own levels.

The amplitude of the fundamental signal in the transistor is key to ensuring that the transistor is operating at the correct operating point (the fundamental signal is referred to hereafter as the fundamental). The required operating point is the point at which the amplitude of the voltage at the fundamental is sufficiently large that odd harmonics have been introduced into the voltage, thereby approximating the voltage to a square wave, but no distortion has been introduced into the drain source current $I_{DS}$ (i.e. that the assumption that the current is a half wave rectified sine wave holds true).

Using theoretical analysis which is described further below, the inventor has found the required voltage amplitude at the fundamental for the correct operating point to be:

$$A_1 = \frac{2}{(m+1)} \cot\left[\frac{\pi}{2(m+1)}\right]$$

where m−1 is the number of odd harmonics that are sustained by the terminating network. This is a remarkable result defining the maximum amplitude of the fundamental component of voltage. The amplitude is a normalised amplitude, and in an implementation of the amplifier will be scaled by the bias voltage $V_{DC}$ (i.e. $V=V_{DC}A_1$).

When the resistor operates at the correct operating point, it will provide the maximum efficiency of:

$$\eta = \frac{\pi}{2(m+1)} \cot\left[\frac{\pi}{2(m+1)}\right]$$

These two equations are universal, and are dependent only upon the terminating conditions (i.e. the number of odd harmonics that are sustained by the terminating network). The equations may be applied to any field effect transistors. The equations are unaffected by the presence of finite reactances at harmonics at 2 m and above, and the resulting coupling of the current waveform to the voltage waveform. Furthermore, where higher ordered harmonics are terminated in finite reactive impedances the same maximum efficiency is obtained, provided that the correct complex termination at the fundamental frequency is used.

The use of the term 'm' is clarified as follows:

m=1 corresponds to the fundamental frequency ($\omega_o$)
m=2 corresponds to the first odd harmonic of the fundamental frequency (3 $\omega_o$)
m=3 corresponds to the second odd harmonic and the first odd harmonic (3 $\omega_o$, 5 $\omega_o$)
m=4 corresponds to the third, second and first odd harmonics:(3 $\omega_o$, 5 $\omega_o$, 7 $\omega_o$), etc.

The inventor has devised a set of rules which are used to determine the values of the capacitors and inductors of the matching network, together with an equation which determines the value of the load, to provide an amplifier which operates with maximum efficiency. The set of rules used to determine the values of the capacitors and inductors of the matching network is as follows (the theoretical basis for these rules is set out further below):

Let $g_r = C_r$ r odd
$= L_r$ r even then $$g_1 = 1, \quad g_1 g_2 = \frac{1}{m(2m-1)}$$

$$g_r g_{r+1} = \frac{4}{(2m-1+r)(2m-r)} \quad r = 2 \to 2m-1$$

and $$g_{2m} g_{2m+1} = \frac{1}{m}$$

The value of the first capacitor $C_{ds}$ is a property of the transistor (the drain source capacitance of the transistor) and cannot be adjusted. For this reason, the values of the inductors and capacitors are normalised to the first capacitor $C_{ds}$. For a given circuit actual values of the inductors and capacitors may be determined by multiplying by the value of $C_{ds}$.

For a network arranged to open circuit the first two odd harmonics (i.e. 3 $\omega_o$ and 5 $\omega_o$) the values of the inductors and capacitors are as follows:

m=3 (this corresponds to the first two odd harmonics)

$$g_1 = 1 \to C_{ds} = C_1 = 1$$

$$r = 1 \quad C_1 L_2 = \frac{1}{3(2 \times 3 - 1)} = \frac{1}{15} \to L_2 = \frac{1}{15}$$

$$r = 2 \quad C_3 L_2 = \frac{4}{(6-1+2)(6-2)} = \frac{4}{28} = \frac{1}{7} \to C_3 = \frac{1}{7} \times \frac{15}{1} = \frac{15}{7}$$

$$r = 3 \quad C_3 L_4 = \frac{4}{(6-1+3)(6-3)} = \frac{4}{24} = \frac{1}{6} \to L_4 = \frac{1}{6} \times \frac{7}{15} = \frac{7}{90}$$

$$r = 4 \quad L_4 C_5 = \frac{4}{(6-1+4)(6-4)} = \frac{4}{18} = \frac{2}{9} \to C_5 = \frac{2}{9} \times \frac{9}{70} = \frac{20}{7}$$

$$r = 5 \quad C_5 L_6 = \frac{4}{(6-1+5)(6-5)} = \frac{4}{10} = \frac{2}{5} \to L_6 = \frac{2}{5} \times \frac{7}{20} = \frac{7}{50}$$

$$r = 6 \quad L_6 C_7 = \frac{1}{3} \to C_7 = \frac{1}{3} \times \frac{50}{7} = \frac{50}{21}$$

Figure 5:
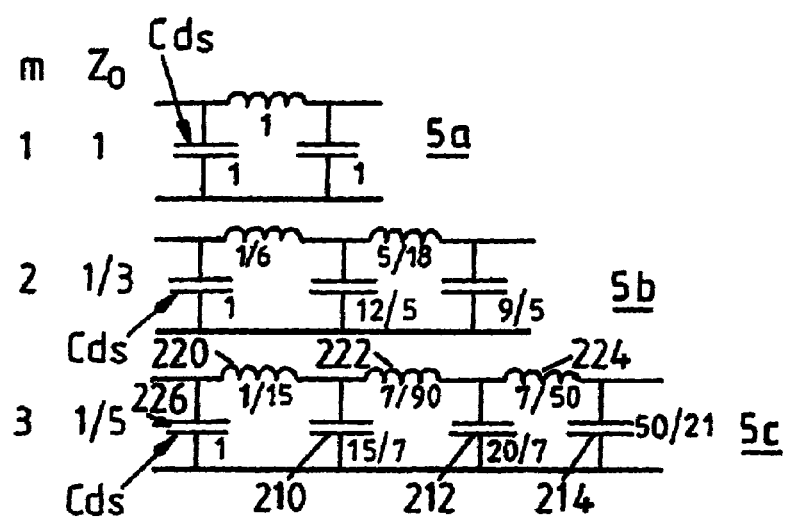
FIG. 5 is a set of circuit diagrams showing terminating networks for amplifiers which embody the invention.

These values are shown in FIG. 5c. FIGS. 5a and 5b show capacitor and inductor values determined for networks for m=2 (i.e. the first odd harmonic) and m=1 (i.e. the fundamental).

The network generated using the set of rules provides open circuits for odd harmonics and short circuits for even harmonics. In addition the network acts as an impedance inverter at the fundamental frequency.

The network of FIG. 5c has the property that the third and fifth harmonics have approximately three and five times the bandwidth of the fundamental frequency. This is an important property since when amplifying a signal with finite bandwidth, three and five times the bandwidth are required at these harmonics in order to avoid distortion of the signal. Prior art matching networks do not have this advantageous property.

The value of the load seen at the output of the field effect transistor is determined using Ohm's law as follows:

$$Z = \frac{V}{I} = \frac{V_{DC} A_1}{I_{MAX}/2} = \frac{2(V_{DC} A_1)}{I_{MAX}}$$

where $V_{DC}$ is the bias voltage, $A_1$ is the normalised voltage amplitude of the fundamental, and $I_{MAX}$ is the maximum amplitude of the current (i.e. of the half wave rectified sine wave).

The field effect transistor sees the load through the matching network and shunt resonator. The matching network and shunt resonator have the property that they are an impedance inverter at the fundamental frequency, which means that the impedance seen by the field effect transistor is:

$$Z = \frac{Z_o^2}{R_L}$$

The shunt resonator $S_R$ is constructed in the conventional way, to allow transmission at the fundamental frequency whilst blocking harmonics.

A specific practical embodiment of an amplifier constructed using the rules devised by the inventor is described further below. In general terms, to construct an amplifier using the rules, the number of odd harmonics which are to be presented with open circuits is determined (i.e. the value of m is determined), and the normalised values of the capacitors and inductors of the terminating network are calculated. The actual values of the capacitors and inductors are determined by multiplying the normalised values by $C_{ds}$. It will be appreciated that small perturbations of the values of inductors and capacitors may arise during construction of the amplifier. These will not prevent the amplifier from functioning at the optimum point, and therefore are not considered to fall outside of the values provided by the set of rules.

Following this the normalised voltage amplitude of the fundamental is calculated and used to determine the required value of the load. The shunt resonator $S_R$ is constructed in the conventional way to provide transmission at the fundamental frequency over the desired bandwidth.

Practical implementations of the amplifier are likely to include unwanted reactive components in the terminating network. Some minor adjustment of the amplifier may be required in order correct for these reactive components. The amplifiers may be constructed such that the load includes an output impedance tuner. The amplifier is turned on, with the load adjusted to be below the optimum value. The value of the load is gradually increased using the output impedance tuner, and the drain source voltage of the transistor is monitored for characteristic peaks (see below). Alternatively, the value of the output of the amplifier may be monitored, the load at which the output amplitude reaches the maximum being the optimum load value. As an alternative to adjusting the value of the load based upon a measured output, the calculation of the load may be adjusted to take account of the reactive components using the following equation:

$$Z = \frac{2V_{dc}}{I_{max}}(A_1 + jX_m)$$

$$X_m = \frac{I_{max}}{\pi V_{dc}} \sum_{n=m}^{\infty} \frac{X(2n)}{(4n^2-1)} \frac{2n}{(m+1)} \left[ \cot\left[\frac{(2n-1)\pi}{2(m+1)}\right] - \cot\left[\frac{(2n+1)\pi}{2(m+1)}\right] \right]$$

together with impedance scaling.

In addition to adjustment of the load, the shunt resonator $S_R$ located between the matching network $N_m$ (see FIG. 4) and the resistor $R_L$ may be adjusted to correct for reactive components. The adjustment comprises de-tuning the resonant frequency of the resonator very slightly. This may be done by monitoring the drain source voltage of the transistor, or the output of the amplifier. Alternatively the adjustment may be calculated using the equation given above.

Figure 6:
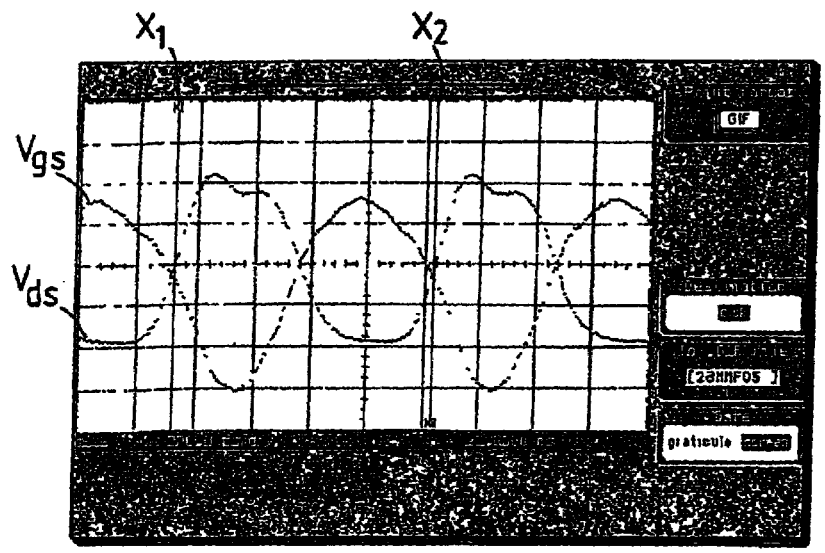
FIG. 6 is an oscilloscope trace showing the temporal variation of drain voltage and gate voltage at the output of a field effect transistor of an amplifier which embodies the invention.

Amplifiers have been constructed by the inventor, using the configuration shown in FIG. 4, with component values determined as described above. FIG. 6 shows an output (drain source voltage) obtained from a field effect transistor (FET), with a terminating network arranged to open circuit the first odd harmonic (i.e. 3 $\omega_o$; m=2). The figure composes two oscilloscope traces, a first trace showing the variation of drain source voltage with respect to time (labelled as $V_{ds}$), and a second trace showing the variation of input gate voltage with respect to time (labelled as $V_{gs}$). For ease of terminology the traces will be discussed in terms of phase, with vertical line X1 indicating zero phase and vertical line X2 indicating 2π phase.

It can be seen in FIG. 6 that the voltage V is not a square wave, as would be the case for a perfect amplifier, but instead is an approximation to a square wave. The voltage waveform can be seen to have clear peaks at π/3 and 2π/3. This is a characteristic of the FET performance when the FET is operating at the optimal point, i.e. when the normalised voltage amplitude of the fundamental is:

$$A_1 = \frac{2}{(m+1)} \cot\left[\frac{\pi}{2(m+1)}\right]$$

The characteristic peaks are very specific and clear. The characteristic peaks may be used to tune the value of the load (described above), the location of the peaks indicating that the correct value of the load has been found. Similarly, the characteristic peaks may be used to tune the resonant frequency of the shunt resonator.

The characteristic peaks stem directly from the selection of the component values using the set of rules given above (this is proved mathematically further below). A given amplifier may be tested to determine whether it is constructed using component values generated using the set of rules, by operating the amplifier and looking for the presence of the characteristic peaks in the output of the FET.

Referring again to FIG. 6, in theory it should be possible to see dips in the voltage $V_{ds}$ at 4π/3 and 5π/3. However, the dips are obscured because the voltage $V_{ds}$ is sufficiently small that modifications of the voltage due to reactive components of the terminating network are larger than the dips. The reactive components also give rise to the skewing of the voltage, such that the peak at π/30 is greater than the peak at 2π/3.

Figure 7:
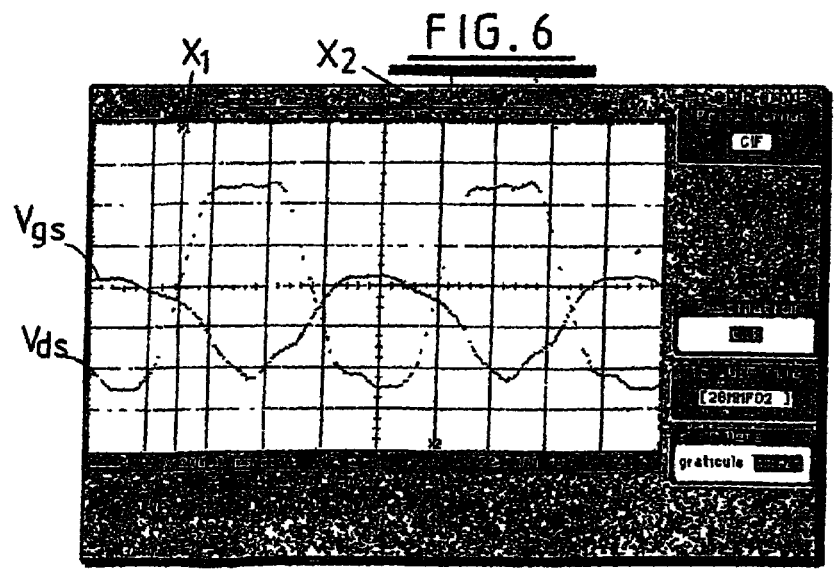
FIG. 7 is an oscilloscope trace showing the temporal variation of drain voltage and gate voltage at the output of a field effect transistor of an amplifier which embodies the invention.

FIG. 7 shows an output obtained from a FET with a terminating network arranged to open circuit the first and second odd harmonic (i.e. 3 $\omega_o$ and 5 $\omega_o$; m=3). The voltage $V_{ds}$ can be seen to have clear peaks at π/4, π/2 and 3π/4. These characteristic peaks stem directly from the selection of the component values using the set of rules given above.

A general rule, derived mathematically below, indicates the phase locations characteristic peaks for any value of m:

$$\theta_r = \frac{r\pi}{(m+1)} \quad r = 1 \to m$$

An amplifier which is constructed using component values generated with the above set of rules will have peaks which conform to this rule.

Figure 8:
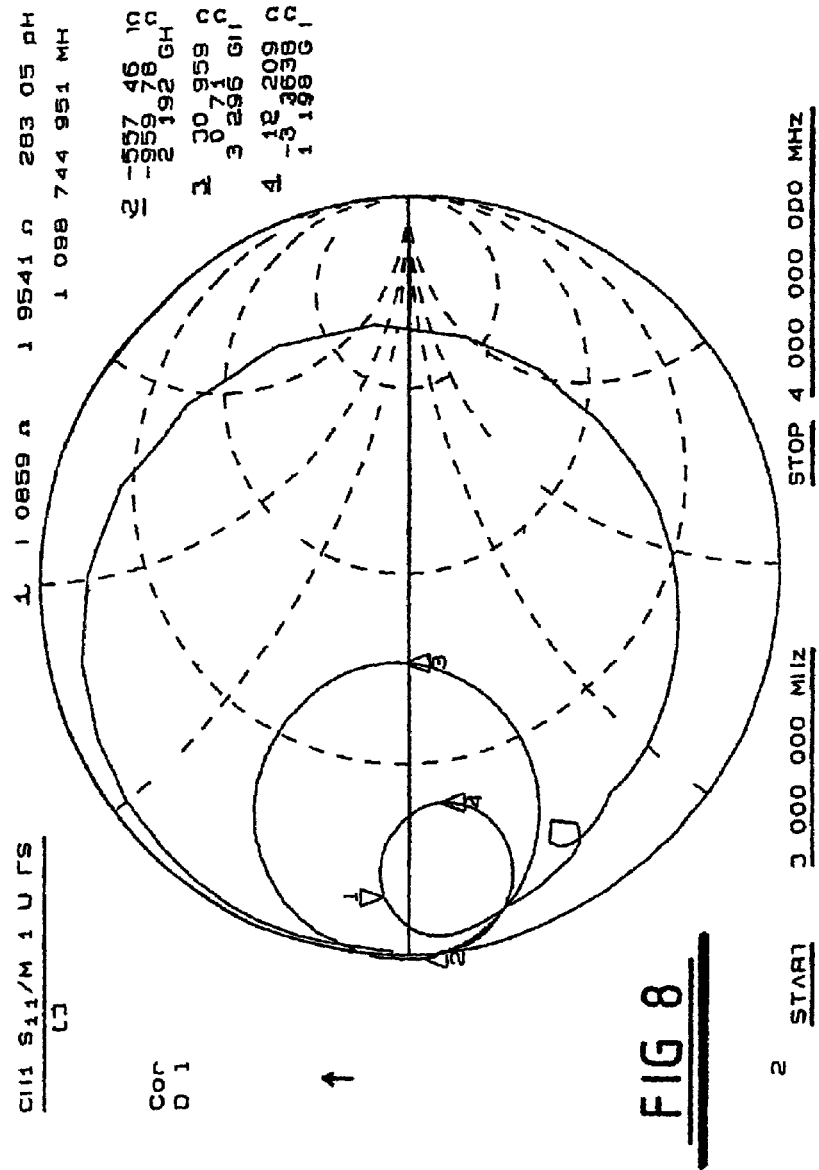
FIG. 8 is a Smith chart obtained for the output impedance seen by an amplifier which embodies the invention.

FIG. 8 is a Smith chart, which characterises the impedance of the terminating network as seen by an amplifier constructed using the above rules, the circuit being arranged to open circuit the first odd harmonic. The Smith chart represents real impedance (circles on the chart), and imaginary impedance (arcs on the chart), with the horizontal line along the centre of the chart representing zero phase (i.e. no imaginary impedance). Four operating points of the circuit are measured; these are shown on the chart as triangles 1 to 4.

Operating point number 4 is the fundamental frequency of operation of the amplifier. It can be seen that operating point number 4 is not on the zero phase axis, in other words that it includes an imaginary impedance part. This is because the device is a modified class F amplifier (i.e. there is some coupling between the higher harmonic currents and voltages due to reactive components in the terminating network). Operating point number 3 is the first odd harmonic of the fundamental frequency (3 $\omega_o$). The fact that operating point number 3 is located towards the right hand side of the smith chart shows that an effective open circuit is provided at the first harmonic, relative to the low impedance level of the terminating network. Operating point number 2 is the first even harmonic of the fundamental frequency (2 $\omega_o$), and can be seen to be a short circuit (i.e. located at the left of the chart). This is as required the voltage should not include the first even harmonic as this will lead to a loss of efficiency. Operating point number 1 is a lower frequency of no significance to the performance of the amplifier.

Figure 9:
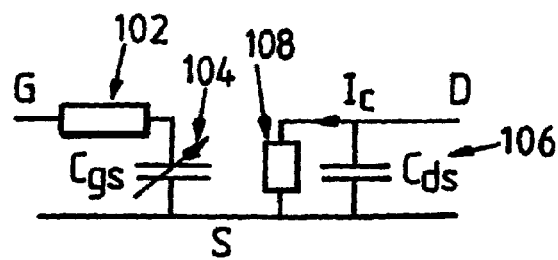
FIG. 9 is a schematic illustration of a pseudomorphic high electron mobility field effect transistor which forms part of an embodiment of the invention.
Figure 10:
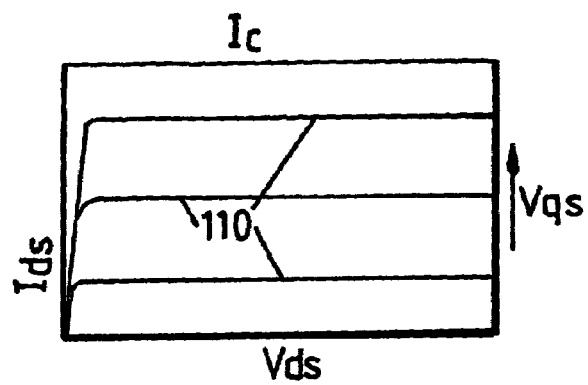
FIG. 10 shows the D.C. characteristics of the transistor of FIG. 9.

A practical embodiment of a transistor and terminating network constructed according to the invention will now be described. In this embodiment the field effect transistor is a PHEMT [Pseudomorphic High Electron Mobility, Transistor], although it will be appreciated that the invention may be embodied using any suitable field effect transistor. The PHEMT has the ability to deliver tens of watts of power at microwave frequencies with a very low resistance in the output of the device. A simplified equivalent PHEMT circuit is shown in FIG. 9. At the input 102, the gate resistance is made as small as possible but the gate capacitance $C_{gs}$ 104 is a varactor whose capacitance at negative bias is comparable to the output drain-source capacitance $C_{ds}$ 106 but can rise in the forward bias state to 6→10 times this value. At the output, the drain-source capacitance $C_{ds}$ 106 is considered to be separable and always treated as part of the network. The remaining current generator 108 which represents the drain-source channel current is therefore frequency independent, as described by the D.C. characteristics of the device as illustrated in FIG. 10, and is dependent upon both the gate and drain voltages. It is very important to note that the channel resistance at low values of $V_{ds}$ is of the order of 0.1 $\Omega$ and typically ten times less than an LDMOS device.

In the subsequent analysis, the effect of the small channel resistance is retained to illustrate the behaviour of the device but in all the theoretical analysis it is assumed to be zero i.e. the characteristics have infinite slope at the D.C. In addition, it is assumed that the maximum instantaneous voltage applied to the gate never saturates $I_{ds}$ and hence the device acts as a linear amplifier.

Figure 11:
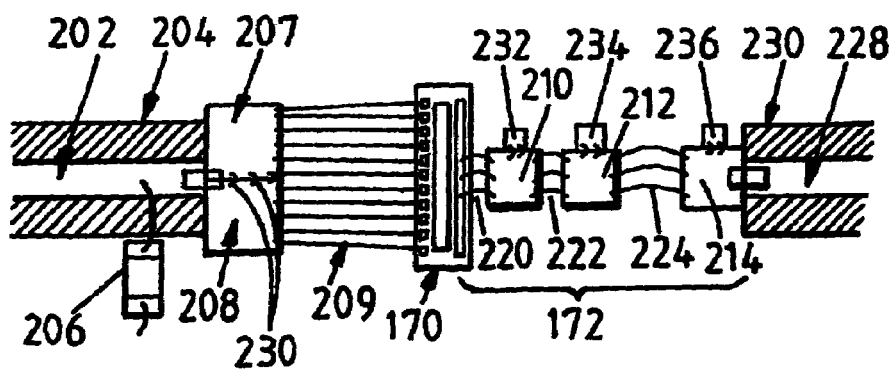
FIG. 11 is a schematic illustration of the physical construction of an amplifier which embodies the invention.

Referring to FIG. 11, amplifier circuitry includes an input coupling in the form of a conducting track 202 on a substrate 204. A damping resistor 206 is connected between track 202 and ground. The resistor 206 improves stability, by preventing small voltage fluctuations which otherwise would be amplified into large voltage fluctuations by the field effect transistor 170 (such fluctuations could lead to oscillation). Two chip capacitors 207, 208 are connected to the input track 202 and to each other by bonded wires 230. These chip capacitors provide impedance matching between the track and the input to the field effect transistor (FET) 170. The chip capacitors are connected by eleven bonded wires 209 to the gate terminals of power FET 170. The FET is a 15.4 mm FET produced by Motorola, and is capable of handling 10 W of power. The eleven bonded wires 209 act as an inductor. An m=3 network 172 is provided by three chip ceramic capacitors 210, 212, 214 connected by bonded wires 220, 222, 224 which each provide an inductor. The length and geometry of the bonded wires 220, 222 and 224 determine their inductance. In terms of implementation, the capacitors can be made on the semiconductor wafer. In an alternative arrangement ceramics may be used to provide the inductors and capacitors.

The inherent drain-source capacitance $C_{DS}$ of FET 170 provides the first capacitive element 226 of the network. A separate capacitive component is not used, but rather the drain-source capacitance of the amplifier device provides an effective capacitance and so the components of the rest of the network must accommodate this inherent capacitance. The common drain terminals of the FET 170 are connected by the first bonded wire inductor 220 to the first chip capacitor 210 of the network. Second and third inductors 222 and 224 connect the first 210 to the second 212 and the second 212 to the third 214 chip capacitors. The third capacitor is then connected to an output tract 228 on a substrate 230. Small, secondary chip capacitors 232, 234, 236 can be provided connected to the primary chip capacitors so as to correct or fine tune the capacitance to that required for correct operation of the terminating network.

Figure 12:
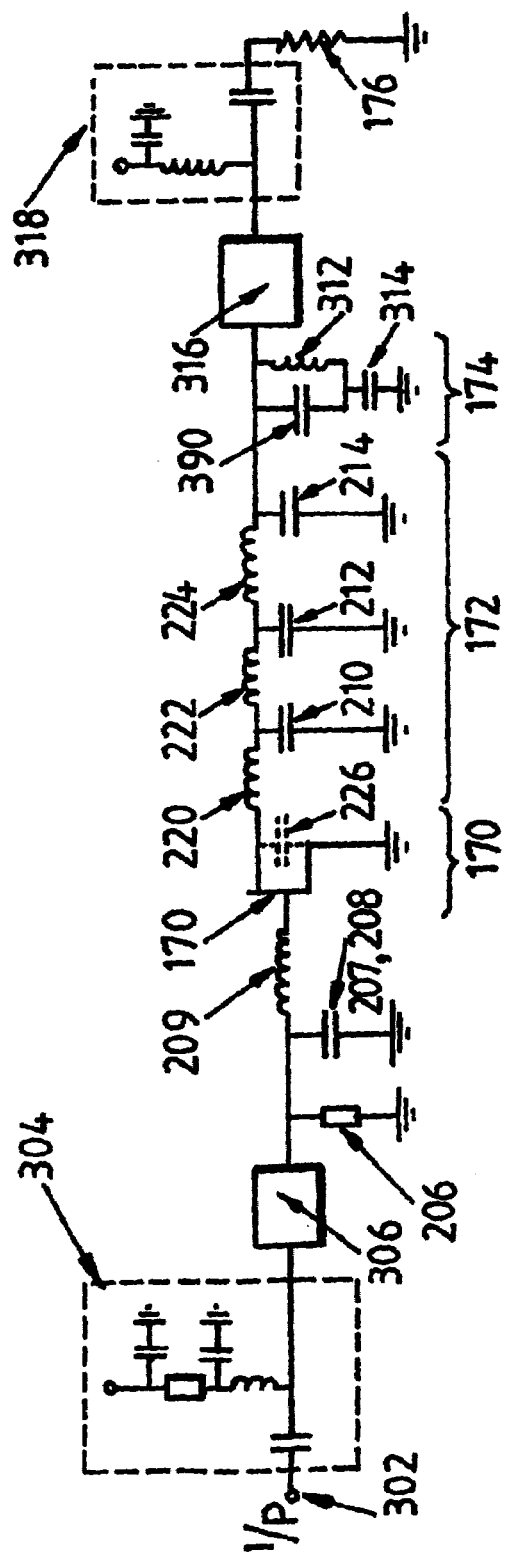
FIG. 12 is a circuit diagram of the amplifier shown in FIG. 11.

FIG. 12 shows a circuit diagram for the amplifier shown in FIG. 11, including additional components. An input 302 for receiving the signal to be amplified is followed by a bias tee 304. The bias tee 304 provides a means for biasing the amplifier with D.C. voltages without interfering with the rf signal. The bias tee 304 biases the FET 170 towards a class B amplifier type bias point such that there is no quiescent current: i.e. the FET 170 draws no current when there is no rf signal supplied. Bias tee 304 sets the gate voltage $V_{gs}$ and does not interfere with the rf signal since it presents a very high input impedance to rf signals.

An input impedance tuner 306 is provided as an intermediate impedance converter so as to help match the impedance of the input to that of the FET. As described above, resistor 206 (typically of order 100 ohms) is provided to help stabilise the FET. Capacitors 207 and 208 provide a capacitance of approximately 8.6 pF, and in combination with input inductor 209 provide further impedance matching to the input impedance of the FET 170.

Turning to the output of the FET 170, the drain-source capacitance $C_{ds}$ 226 provides the first capacitive element of the m=3 matching network 172, the remainder of which is realised by chip capacitors 210, 212, 214 and bonded wire inductors 220, 222, 224.

A shunt resonator 174 is provided at the output of the terminating circuit to provide a short circuit to signals to all harmonics above the fundamental frequency. The shunt resonator includes a capacitor 310 and inductor 312. Capacitor 314 prevents a DC short to ground, but allows rf to pass. The shunt resonator 174 plays a part in providing the short circuit for the second harmonic. That is, the shunt resonator 174 acts together with the inductor 220 and capacitor 210 to short circuit the second harmonic.

An output impedance tuner 316 of conventional design is provided together with an output bias tee 318. The output bias tee 318 can handle currents of up to 2 A, but typically provides 15 A. Finally a resistive load 176 is connected to the output of the bias tee 318.

The amplifier may operate at frequencies up to 10 GHz or higher.

The input impedance tuner 304 and output impedance tuner 316 may be used to provide matching between the transistor and its input and output. Although component values for $1^{st}$ $2^{nd}$ and $3^{rd}$ order circuits only (i.e. m=1, 2 and 3) are described, the invention is not limited to those orders. Appropriate component values for higher orders may be determined using the above set of rules. Although a particular realisation of an m=3 terminating network has been described in detail, the construction of particular realisations of other order terminating circuits according to the invention will also be apparent to those of ordinary skill in the art, and the invention is not limited to the particular realisation of the m=3 described above. It will be appreciated that the invention may be used with any suitable field effect transistor.

The theoretical basis for equation 1 and for the rules used to determine the values of the capacitors and the inductors will now be described.

As previously indicated, the theory includes one assumption, i.e. that the drain current has the form of a half wave rectified sine wave (FIG. 3). Although in practice the current may not be exactly of this form, it is possible to keep the current close to this form, so that the assumption holds true to a sufficient extent to allow the theory to be implemented in practice. A sine wave is used because the capacitance of the gate is such that it would be extremely difficult to make current rise or fall at a rate greater than the slope of a sine wave.

Figure 13:
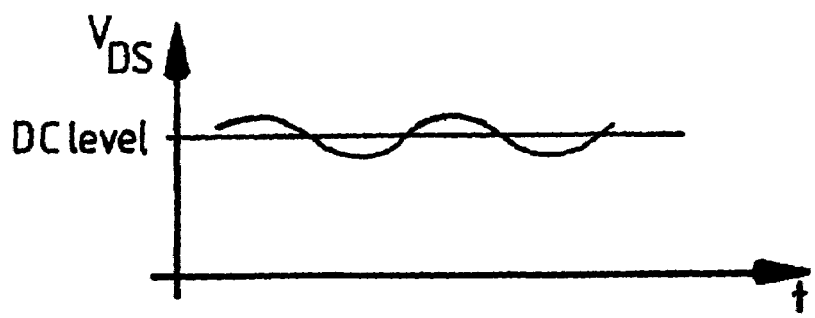
FIG. 13 shows the output voltage of the amplifier operating in a linear regime.

The transistor has a non-zero DC level of drain source voltage. This is applied by a separate DC bias. When a low resistive load $R_L$ is connected to the shunt resonator, this will result in a sine wave voltage output, which does not deviate significantly from the DC level. The sine wave and the DC level are shown in FIG. 13. Under this operating condition the transistor operates linearly, and has characteristics indicated by the drain source current verses drain source voltage graph shown in FIG. 14. It can be seen that once the drain source current has risen above a threshold, the amount of current output by the transistor is independent of the drain source voltage. However, at low drain source voltages there is a limit to the amount of current that is supplied for a given drain source voltage. The slope S relates to the effective resistance of the channel between the drain and the source. The voltage $V_{DS}$ cannot go negative, since it is constrained from doing so by the slope S (the slope S cannot be breached). Since the amplitude of the voltage sine wave is low, the transistor is providing an output power that is some way below its maximum.

Figure 15:
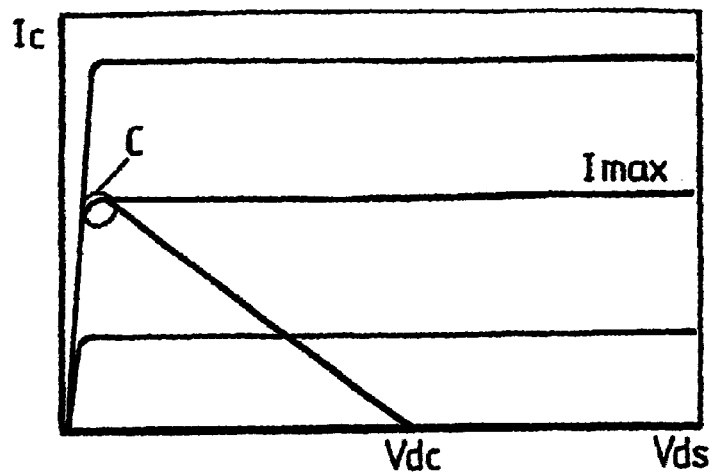
FIG. 15 shows a load line for an amplifier constructed according to the invention.
Figure 16:
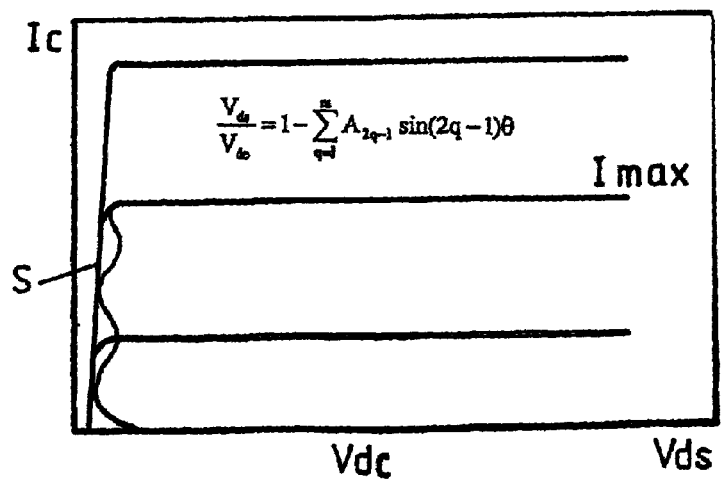
FIG. 16 shows a load line for an amplifier constructed according to the invention, illustrating non-linear operation of the amplifier.

What is required is to move away from the linear operation of the transistor, and move to a non-linear point which, referring to FIG. 15, is the cusp C at which the load line turns over. In order to reach this point harmonics must be present in the transistor. This cannot happen when the transistor is operating as shown in FIG. 13, i.e. with a small resistive load, since the voltage has the form of a sine wave at the fundamental frequency. What is required is that the amplitude of the voltage sine wave becomes sufficient that it touches the $V_{DS}$=0 axis ($V_{DS}$ cannot go negative) and begins to distort, thereby introducing harmonics into the voltage waveform. The physical mechanism that causes the harmonics to arise is unimportant; all that is required is that the harmonics arise somehow or other. The amplitude of the voltage waveform should be sufficient to generate an approximation to a square wave, without distortion of the waveform of the drain source current. The optimum operating point occurs when the drain source current is on the cusp of beginning to distort. This allows the transistor to operate with optimum efficiency. Referring to FIG. 16, when the transistor operates at the optimum point, significant values of voltage occur when the current is close to zero, and significant values of current occur when the voltage is close to zero (as is required for optimum efficiency). The ripple seen at low voltages derives from the same circuit properties which give rise to the ripples of voltage seen in FIGS. 6 and 7. Note that the curve cannot pass through the slope S, as this is determined by physical properties of the transistor channel.

Figure 17:
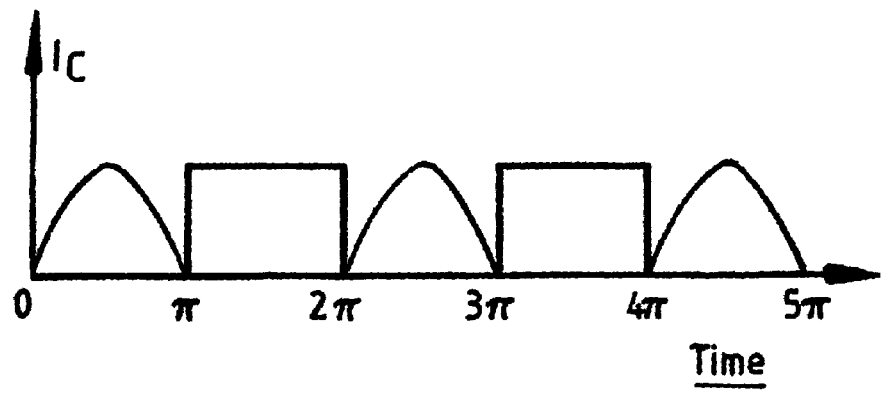
FIG. 17 is a half wave rectified sine wave together with a square wave.

The theory developed by the inventor is fundamentally different from previously devised numerical techniques. In a perfect terminating network the square wave voltage would not overlap at any point with the half-wave rectified sine wave current, as shown in FIG. 17. This means that there would be no relationship between the drain source current and the drain source voltage. The numerical techniques used by the prior art are all based upon models which define relationships between the drain source current and the drain source voltage, and are thus of limited value.

The inventor has realised that it is not necessary to determine the amplitudes of the voltage waveform at the fundamental frequency and each of the odd harmonics in the terminating circuit, as is done in numerical modelling techniques. The inventor has realised that the only amplitude that is important is the amplitude at the fundamental frequency, and that the amplitudes of the odd harmonics will be automatically generated by the terminating network. Optimum efficiency occurs when the correct amplitude of the fundamental is provided in the amplifier.

Figure 19:
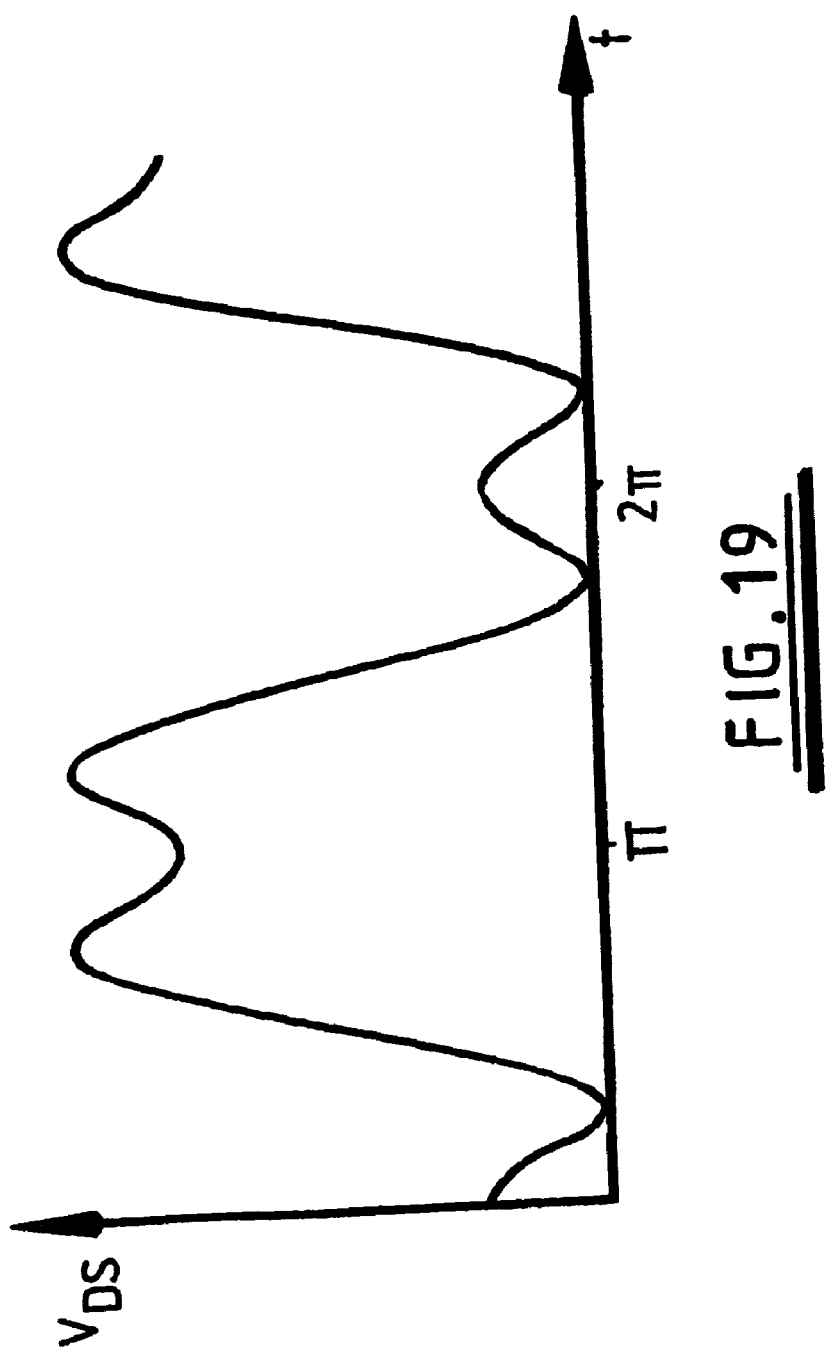
FIG. 19 shows the output voltage for an amplifier constructed according to the invention (m=2).

The solution is based upon determining the points at which the voltage $V_{DS}$ is zero, and the derivative of the voltage is zero, i.e. the points at which the voltage touches zero as shown in FIG. 19.

Initially, a Class B amplifier operation is assumed with the transistor operating linearly and not into saturation, with an terminating network capable of providing the correct termination for the maximum efficiency of π/4. Increasing the resistive termination beyond the optimum point results in the current waveform no longer being a half wave rectified sine wave with a consequent reduction in efficiency. The maximum efficiency is achieved when the system equations are singular.

If the output of the transistor is terminated in a shunt inductor, to resonate the output capacitance at the fundamental frequency $\omega_o$, and a resistive load at $\omega_o$, then by biasing the gate voltage to cut-off at zero, we then have the classical Class B operation with all harmonics short circuited. Initially, it is assumed that the channel current is a half wave rectified sine wave with a Fourier Series expansion, as illustrated in FIG. 4, of:

$$I_c = I_{max}\left[\frac{1}{2}\sin\theta + \frac{1}{\pi}\left(1 - \frac{2}{3}\cos2\theta - \frac{2}{15}\cos4\theta - \frac{2}{35}\cos6\theta \ldots \right)\right] \quad (1)$$

$$= I_{max}\left[\frac{1}{2}\sin\theta + \frac{1}{\pi}\left(1 - \sum_{r=1}^{\infty}\frac{2\cos2r\theta}{(4r^2-1)}\right)\right]$$

where $\theta=\omega_0 t$, and where it is assumed that the circuit is biased and decoupled in the normal way at D.C.

Since all harmonics are short circuited, $$V_{ds} = V_{dc}[1 - A_1 \sin\theta] \quad (2)$$

Figure 14:
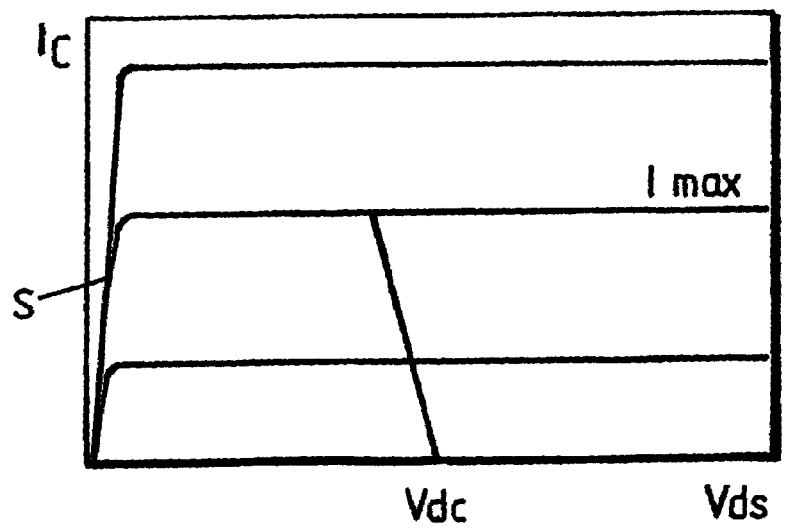
FIG. 14 shows a load line for the amplifier of FIG. 13.

$A_1$ is proportional to the load resistor for $A_1 \ll 1$ and the overall behaviour can be characterised by the load line representation shown in FIG. 14.

As $A_1=1$ is reached, the critical behaviour is shown in FIG. 15 where $V_{ds}=0$ at $$\theta = \frac{\pi}{2}.$$

At this point, $$\text{Power at D.C.} = P_{dc} = \frac{V_{dc} I_{max}}{\pi} \quad (3)$$

and $$\text{Power at fundamental} = P_{rf} = \frac{A_1}{4} V_{dc} I_{max} \quad (4)$$

and since $A_1=1$, efficiency is $$\eta = \frac{P_{rf}}{P_{dc}} = \frac{\pi}{4} \quad (5)$$

which is the classical Class B result (i.e. the transistor operating at maximum efficiency when there are no harmonics of voltage present).

If the load resistance is increased further, since the voltage waveform may only have a D.C. component and a component at the fundamental frequency and may not become negative immediately from the I–V characteristics, then $A_1$ must remain at unity and the current waveform must be modified. The only possible behaviour is a sharp reduction in the channel current $I_c$ at $\theta=\pi/2$. This may be approximated by a delta function at this point with a resulting Fourier Series of:

$$F(\theta) = \frac{-I_{max}\epsilon}{2\pi}[1 + 2\sin\theta - 2\cos2\theta - 2\sin3\theta + 2\cos4\theta + 2\sin5\theta \ldots ] \quad (6)$$

Resulting in the overall current having components at all the harmonic frequencies and:

$$P_{dc} = \left(1 - \frac{\epsilon}{2}\right)\frac{V_{dc} I_{max}}{\pi} \quad (7)$$

and $$P_{rf} = \left(1 - \frac{2\epsilon}{\pi}\right)\frac{V_{dc} I_{max}}{4} \quad (8)$$

Hence efficiency:

$$\eta = \left(\frac{1 - \frac{2\epsilon}{\pi}}{1 - \frac{\epsilon}{2}}\right)\frac{\pi}{4} \quad (9)$$

which is less than $\frac{\pi}{4}$.

What has actually happened in this situation is that as the resistive load is increased in value, then the amplitude of the fundamental component of voltage $A_1$ has linearly increased to unity and then remained constant at this value beyond that point. Hence, this point is a singular point and occurs at a unique value of $\theta=\pi/2$ and represents the maximum efficiency available. The above analysis may appear trivial but it is the basis for the development of the optimum solutions for both the Class F and modified Class F conditions.

To increase efficiency, harmonic components of voltage must be allowed to exist in the output circuit. This situation will now be investigated by considering both the Class F and modified Class F situations.

Class F Operation

Initially, it will be assumed that all of the odd harmonics are open circuited up to the 2m–1 harmonic (for example if m=3 then the first two odd harmonics are open circuited, i.e. 3 $\omega_o$ and 5 $\omega_o$). All higher odd harmonic and all even harmonics will be assumed to be terminated in short circuits. Thus, again, we may assume that the current waveform is the same as the Class B operation given in equation 1 for a linear operation. The voltage waveform will now be of the form:

$$\frac{V_{ds}}{V_{dc}} = 1 - \sum_{q=1}^{m} A_{2q-1}\sin(2q-1)\theta \quad (10)$$

Figure 18:
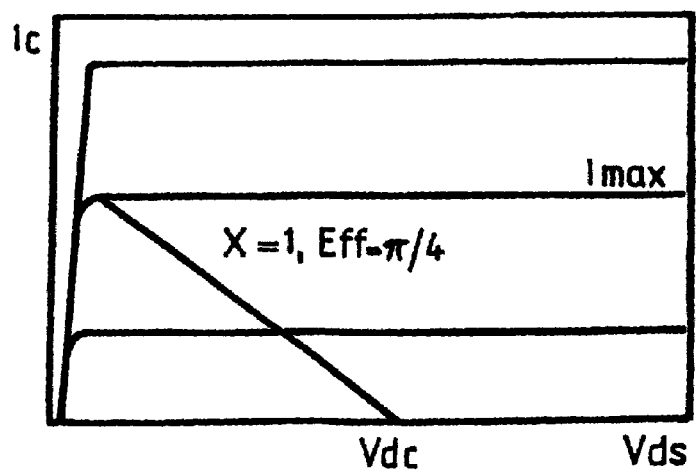
FIG. 18 is a load line for an amplifier which has not been constructed according to the invention.

As the resistive load at the fundamental is increased, then $A_1$ approaches unity as in the Class B case. Up to this point, there is no reason why the higher frequency components of the voltage waveform should not be non zero, resulting in the load line shown in FIG. 18. Further increases in the load resistance could then allow $A_1$ to exceed unity.

Firstly, the current waveform cannot be distorted as in the Class B operation as this would require current components at the lower odd harmonic frequencies. Secondly, the current cannot rise faster than the sinusoidal component at the fundamental frequency. Hence, the load line becomes distorted and moves towards that shown in FIG. 16. There is no reason why the voltage components at the higher odd harmonic frequencies should have any particular value other than being constrained by the overall I–V characteristic.

$A_1$ is initially proportional to the resistive termination at the fundamental frequency. As $A_1$ equals unity, we have the efficiency:

$$\eta = \frac{\pi}{4} \quad (11)$$

as $A_1$ increases with the load, if it could attain the value of 4/π then deficiency would be unity which is clearly not attainable for finite m. Therefore, somewhere between these two values, a critical value for $A_1$ must be obtained which will result in a maximum efficiency for a given value of m. An initial investigation of equation (10) shows that this may be zero at m values of $\theta$ which must be symmetrical around $$\theta = \frac{\pi}{2}.$$

Furthermore, from the I–V characteristic, it is clear that near any zero, the voltage cannot be negative and hence each zero must be a turning point. Thus if:

$$F(\theta) = 1 - \sum_{q=1}^{m} A_{2q-1} \sin(2q-1)\theta \qquad (12)$$

Then $F(\theta_r) = 0 \qquad r = 1 \rightarrow m$ (13)

Also, $F'(\theta_r) = 0 \qquad r = 1 \rightarrow m$ (14)

Due to the symmetry around $$\theta = \frac{\pi}{2}$$

the number of independent equations from (13) is $$\frac{m}{2}$$

for m even and $$\frac{m+1}{2}$$

for m odd which must include $$\theta_{\frac{m+1}{2}} = \frac{\pi}{2}.$$

However, there are m coefficients $A_{2q-1}$, q=1→m. In principle, the remaining equations come from the set of equations (14). As the load resistor is increased and the critical value of $A_1$ is obtained to yield maximum efficiency, then the system of equations must become singular and, in particular, $A_1$ must be determined from the set of equations (13) without directly being able to evaluate $A_{2q-1}$ for q=2→m.

In the prior art, where numerical techniques have been deployed to determine maximum efficiency, the problems associated with the system of equations being solved are those related to a singular solution being approached.

Thus, there must exist a unique set of $\theta_r$, r=1→m, which results in the determination of the critical value of $A_1$ where the whole system of equations is singular.

In principle, one could assume an arbitrary set of zeros at which the singular solution exists and then derive a unique set of zeros which force the singular solution. This approach is very complex and hence, an alternative is presented whereby the answer is assumed and by using this answer, the system of equations is shown to be singular.

It will now be shown that this unique set of zeros is:

$$\theta_r = \frac{r\pi}{(m+1)} \qquad r = 1 \rightarrow m \qquad (15)$$

which from equations (12) and (13) results in:

$$0 = 1 - \sum_{q=1}^{m} A_{2q-1} \sin\left[\frac{(2q-1)r\pi}{(m+1)}\right] \qquad r = 1 \rightarrow m \qquad (16)$$

Multiplying each equation in turn by:

$$\sin\left[\frac{r\pi}{m+1}\right]$$

and adding, gives the single equation:

$$\sum_{r=1}^{m} \sin\left[\frac{r\pi}{m+1}\right] = \sum_{r=1}^{m} \sum_{q=1}^{m} A_{2q-1} \sin\left[\frac{(2q-1)r\pi}{m+1}\right] \sin\left[\frac{r\pi}{m+1}\right] \qquad (17)$$

$$= \sum_{q=1}^{m} A_{2q-1} H_q \qquad (18)$$

where $$H_q = \sum_{r=1}^{m} \sin\left[\frac{(2q-1)r\pi}{m+1}\right] \sin\left[\frac{r\pi}{m+1}\right] \qquad (19)$$

$$= \frac{1}{2} \sum_{r=1}^{m} \left[\cos\left[\frac{2(q-1)r\pi}{m+1}\right] - \cos\left[\frac{2qr\pi}{m+1}\right]\right] \qquad (20)$$

Let $X_n = \sum_{r=1}^{m} \cos\left[\frac{2nr\pi}{m+1}\right]$ (21)

Then $$X_n \sin\left[\frac{n\pi}{m+1}\right] = \sum_{r=1}^{m} \cos\left[\frac{2nr\pi}{m+1}\right] \sin\left[\frac{n\pi}{m+1}\right] \qquad (22)$$

$$= \frac{1}{2} \sum_{r=1}^{m} \left[\sin\left[\frac{n(2r+1)\pi}{m+1}\right] - \sin\left[\frac{n(2r-1)\pi}{m+1}\right]\right]$$

$$= \frac{1}{2} \left[\sin\left[\frac{n(2m+1)\pi}{m+1}\right] - \sin\left[\frac{n\pi}{m+1}\right]\right]$$

$$= \frac{1}{2} \left[\sin\left[2n\pi - \frac{n\pi}{m+1}\right] - \sin\left[\frac{n\pi}{m+1}\right]\right]$$

$$= -\sin\left[\frac{n\pi}{m+1}\right] \qquad (23)$$

Therefore, $$X_n = -1 \qquad n \neq 0 \qquad (24)$$

but from (20), $$H_q = \frac{1}{2} \lfloor X_{q-1} - X_q \rfloor$$

$$= 0 \qquad q \neq 1 \qquad (25)$$

which is the fundamental condition for a singular solution. Hence, substituting in equation (17)

$$\sum_{r=1}^{m} \sin\left[\frac{r\pi}{m+1}\right] = A_1 \sum_{r=1}^{m} \sin^2\left[\frac{r\pi}{m+1}\right] \qquad (26)$$

Let

-continued $$Y_m = \sum_{r=1}^{m} \sin\left[\frac{r\pi}{m+1}\right] \quad (27)$$

then $$Y_m \sin\left[\frac{r\pi}{2(m+1)}\right] = \sum_{r=1}^{m} \sin\left[\frac{r\pi}{m+1}\right]\sin\left[\frac{r\pi}{2(m+1)}\right]$$

$$= \frac{1}{2}\sum_{r=1}^{m}\left[\cos\left[\frac{(2r-1)\pi}{2(m+1)}\right] - \cos\left[\frac{(2r+1)\pi}{2(m+1)}\right]\right]$$

$$= \frac{1}{2}\left[\cos\left[\frac{\pi}{2(m+1)}\right] - \cos\left[\frac{(2m+1)\pi}{2(m+1)}\right]\right]$$

$$= \frac{1}{2}\left[\cos\left[\frac{\pi}{2(m+1)}\right] - \cos\left[\pi - \frac{\pi}{2(m+1)}\right]\right]$$

$$= \cos\left[\frac{\pi}{2(m+1)}\right]$$

Therefore $$Y_m = \cot\left[\frac{\pi}{2(m+1)}\right] \quad (28)$$

Returning to equation (26), let $$Z_m = \sum_{r=1}^{m} \sin^2\left[\frac{r\pi}{m+1}\right]$$

$$= \frac{1}{2}\sum_{r=1}^{m}\left[1 - \cos\left[\frac{2r\pi}{m+1}\right]\right]$$

$$= \frac{m}{2} - \frac{1}{2}\sum_{r=1}^{m}\cos\left[\frac{2r\pi}{m+1}\right]$$

which from equations (21) and (24) for n=1 gives $$Z_m = \frac{m+1}{2} \quad (29)$$

Substituting in equation (26) then yields $$A_1 = \frac{2}{(m+1)}\cot\left[\frac{\pi}{2(m+1)}\right] \quad (30)$$

which is a remarkable result defining the maximum amplitude of the fundamental component of voltage. This also gives the maximum efficiency of:

$$\eta = \frac{\pi}{2(m+1)}\cot\left[\frac{\pi}{2(m+1)}\right] \quad (31)$$

which is universal and dependent only upon the terminating conditions.

Modified Class F Operation

Again, it will be assumed that all of the odd harmonics are open circuited up to the 2m−1th harmonic (i.e. if m=3, up to 5 $\omega_o$). Secondly, it will be assumed that all of the even harmonics are short circuited up to the (2m−2)th harmonic (i.e. if m=3, up to 4 $\omega_o$). Finally, for all harmonics, 2m and above, it will be assumed that the voltage and current waveforms are related by a set of reactances:

$$X(n), n=2m \to \infty \quad (32)$$

This situation, as will be shown, corresponds to a termination capable of being obtained from a finite, linear, passive network.

Again, we assume that the current waveform is the same as the Class B operation given in equation (1). The voltage waveform will now be of the form $$\frac{V_{ds}}{V_{dc}} = 1 - \sum_{q=1}^{m} A_{2q-1}\sin(2q-1)\theta - \quad (33)$$

$$\frac{I_{\max}}{\pi V_{dc}}\sum_{n=m}^{\infty}\frac{X(2n)}{(4n^2-1)}\left[\sin 2n\theta - \sum_{q=1}^{m}B_{n,2q-1}\cos(2q-1)\theta\right]$$

The additional terms arise from the finite reactances at the higher even harmonics 2m and above coupling the even harmonic current terms into voltages. For each such voltage term generated, cosine terms at the odd harmonics will also be generated up to the (2m−1)th harmonic.

From equation (33), the key additional functions are $$F_n(\theta) = \sin 2n\theta - \sum_{q=1}^{m} B_{n,2q-1}\cos(2q-1)\theta$$

which due to the singular behaviour at the zeros $$\theta_r = \frac{r\pi}{m+1} \quad r = 1 \to m \quad (34)$$

will have, $$F_n(\theta_r) = 0 \quad (35)$$

and $$F'_n(\theta_r) = 0 \quad (36)$$

In this case the unique singular solution comes from the set of equations (36) resulting in $$2n\cos(2n\theta_r) = -\sum_{q=1}^{m}(2q-1)B_{n,2q-1}\sin[(2q-1)\theta_r] \quad (37)$$

Multiplying each equation by $$\sin\left[\frac{r\pi}{m+1}\right]$$

and adding gives $$2n\sum_{r=1}^{m}\cos\left[\frac{2r\pi}{m+1}\right]\sin\left[\frac{r\pi}{m+1}\right]= \qquad (38)$$

$$-\sum_{q=1}^{m}(2q-1)B_{n,2q-1}\sum_{r=1}^{m}\sin\left[\frac{(2q-1)r\pi}{m+1}\right]\sin\left[\frac{r\pi}{m+1}\right]$$

which from equation (25) reduces to $$2n\sum_{r=1}^{m}\cos\left[\frac{2rn\pi}{m+1}\right]\sin\left[\frac{r\pi}{m+1}\right]=-B_{n,1}\sum_{r=1}^{m}\sin^{2}\left[\frac{r\pi}{m+1}\right] \qquad (39)$$

$$=B_{n,1}\frac{(m+1)}{2} \qquad (40)$$

from equation (29).

Let (41)

$$X_{n}=\sum_{r=1}^{m}\cos\left[\frac{2rn\pi}{m+1}\right]\sin\left[\frac{r\pi}{m+1}\right]$$

$$=\frac{1}{2}\left[\sum_{r=1}^{m}\left[\sin\left[\frac{(2n+1)r\pi}{m+1}\right]-\sin\left[\frac{(2n-1)r\pi}{m+1}\right]\right]\right]$$

Now let (42)

$$Y_{n}=\sum_{r=1}^{m}\sin\left[\frac{(2n-1)r\pi}{m+1}\right]$$

hence, $$Y_{n}\sin\left[\frac{(2n-1)\pi}{2(m+1)}\right]=\sum_{r=1}^{m}\sin\left[\frac{(2n-1)r\pi}{m+1}\right]\sin\left[\frac{(2n-1)\pi}{2(m+1)}\right] \qquad (43)$$

$$=\frac{1}{2}\sum_{r=1}^{m}\left[\cos\left[\frac{(2n-1)(2r-1)\pi}{2(m+1)}\right]-\cos\left[\frac{(2n-1)(2r+1)\pi}{2(m+1)}\right]\right]$$

$$=\frac{1}{2}\left[\cos\left[\frac{(2n-1)\pi}{2(m+1)}\right]-\cos\left[\frac{(2n-1)(2m+1)\pi}{2(m+1)}\right]\right]$$

$$=\frac{1}{2}\left[\cos\left[\frac{(2n-1)\pi}{2(m+1)}\right]-\cos\left[(2n-1)\pi-\frac{(2n-1)\pi}{2(m+1)}\right]\right]$$

$$=\cos\left[\frac{(2n-1)\pi}{2(m+1)}\right]$$

Hence $$Y_{n}=\cot\left[\frac{(2n-1)\pi}{2(m+1)}\right] \qquad (44)$$

substituting into equation (41) yields $$X_{n}=\frac{1}{2}\left[\cot\left[\frac{(2n+1)\pi}{2(m+1)}\right]-\cot\left[\frac{(2n-1)\pi}{2(m+1)}\right]\right] \qquad (45)$$

which is in turn substituted into equation (40) to give $$B_{n,1}=\frac{2n}{(m+1)}\left[\cot\left[\frac{(2n-1)\pi}{2(m+1)}\right]-\cot\left[\frac{(2n+1)\pi}{2(m+1)}\right]\right] \qquad (46)$$

Hence the cos θ term in the voltage waveform at the fundamental frequency is $$X_{m}=\frac{I_{\max}}{\pi V_{dc}}\sum_{n=m}^{\infty}\frac{X(2n)}{(4n^{2}-1)}\frac{2n}{(m+1)}\left[\cot\left[\frac{(2n-1)\pi}{2(m+1)}\right]-\cot\left[\frac{(2n+1)\pi}{2(m+1)}\right]\right] \qquad (47)$$

resulting in the overall complex impedance termination at the fundamental frequency for optimum efficiency being $$\frac{2V_{dc}}{I_{\max}}(A_{1}+jX_{m}) \qquad (48)$$

The voltage waveform no longer possesses an odd characteristic around the D.C. level. Hence the typical characteristic shown in FIG. 6 will split into a different trajectory for decreasing and increasing voltage, and the peaks will be at slightly different levels.

The invention claimed is:

1. An amplifier comprising a field effect transistor with output capacitance $C_1$, a terminating network comprising inductors connected in series separated by capacitors connected in parallel, a filter and a load, wherein the values of the capacitors and inductors are arranged to present open circuits to a predetermined number of odd harmonics of a signal frequency being amplified, and to present short circuits to a predetermined number of even harmonics of the signal frequency, wherein the normalised values of the inductors and capacitors of the terminating network are selected using the following procedure:

Let $g_r = C_r$  $r$ odd
$\quad\quad = L_r$  $r$ even then $g_1 = 1,\quad\quad g_1 g_2 = \dfrac{1}{m(2m-1)}$ $$g_r g_{r+1}=\frac{4}{(2m-1+r)(2m-r)}\quad r=2\to 2m-1$$

and $$g_{2m}g_{2m+1}=\frac{1}{m}$$

where (m−1) represents the predetermined number of odd harmonics which are presented with an open circuit.

2. An amplifier according to claim 1, wherein the value of the load is selected such that the normalised amplitude of the fundamental signal frequency in the amplification means is:

$$A_{1}=\frac{2}{(m+1)}\cot\left[\frac{\pi}{2(m+1)}\right]$$

thereby allowing the amplifier to operate at an efficiency of:

$$\eta = \frac{\pi}{2(m+1)}\cot\left[\frac{\pi}{2(m+1)}\right].$$

3. An amplifier according to claim 2, wherein the value of the load is determined from:

$$Z = \frac{2(V_{DC}A_1)}{I_{MAX}}, \quad R_L = \frac{Z_o^2}{Z}, \quad Z_o = \frac{1}{(2m-1)}.$$

4. An amplifier according to claim 3, wherein the value of the load is adjusted, to correct for reactive components generated by coupling between higher ordered harmonics of the signal frequency.

5. An amplifier according to claim 4, wherein the adjustment is made by monitoring the drain source voltage of the amplifier, and observing characteristic peaks of the drain source voltage.

6. An amplifier according to claim 4, wherein the adjustment is determined from:

$$Z = \frac{2V_{dc}}{I_{max}}(A_1 + jX_m),$$

$$X_m = \frac{I_{max}}{\pi V_{dc}}\sum_{n=m}^{\infty}\frac{X(2n)}{(4n^2-1)}\frac{2n}{(m+1)}\left[\cot\left[\frac{(2n-1)\pi}{2(m+1)}\right]-\cot\left[\frac{(2n+1)\pi}{2(m+1)}\right]\right].$$

7. An amplifier according to claim 1, wherein the filter comprises a shunt resonator tuned to the signal frequency.

8. An amplifier according to claim 7, wherein the shunt resonator is detuned from the signal frequency, to correct for reactive components generated by coupling between higher ordered harmonics of the signal frequency.

9. An amplifier according to claim 8, wherein the adjustment is made by monitoring the drain source voltage of the amplifier, and observing characteristic peaks of the drain source voltage.

10. An amplifier according to claim 8, wherein the adjustment is determined from:

$$Z = \frac{2V_{dc}}{I_{max}}(A_1 + jX_m),$$

$$X_m = \frac{I_{max}}{\pi V_{dc}}\sum_{n=m}^{\infty}\frac{X(2n)}{(4n^2-1)}\frac{2n}{(m+1)}\left[\cot\left[\frac{(2n-1)\pi}{2(m+1)}\right]-\cot\left[\frac{(2n+1)\pi}{2(m+1)}\right]\right].$$

11. An amplifier according to claim 1, wherein the normalised values of the capacitors and inductors are converted to real values by multiplying them by the value of the inherent drain source capacitance of the field effect transistor.

12. An amplifier according to claim 1, wherein the terminating network further comprises an output impedance tuner.

13. An amplifier according claim 1, wherein the amplifier further comprises inductors and capacitors arranged to provide input impedance matching at an input of the field effect transistor.

14. An amplifier according to claim 1, wherein the inductors of the terminating network are formed from bonded wires.

15. An amplifier according to claim 1, wherein the terminating network is formed from Low Temperature Co-Fired Ceramics (LTCC).

16. An amplifier according to claim 1, wherein the field effect transistor comprises a pseudomorphic high electron mobility transistor.

17. An amplifier comprising a field effect transistor and a terminating network, the terminating network being configured to present open circuits to (m−1) odd harmonics of a signal to be amplified, the terminating network further being configured to allow the field effect transistor to operate at an optimum efficiency such that the drain source voltage of the field effect transistor includes peaks located at the following phases:

$$\theta_r = \frac{r\pi}{(m+1)} \quad r = 1 \rightarrow m$$

wherein the terminating network comprises inductors connected in series separated by capacitors connected in parallel, a filter and a load, wherein the normalised values of the inductors and capacitors of the terminating network are selected using the following procedure:

Let $g_r = C_r$ $r$ odd $\quad\quad = L_r$ $r$ even then $$g_1 = 1, \quad g_1 g_2 = \frac{1}{m(2m-1)}$$

$$g_r g_{r+1} = \frac{4}{(2m-1+r)(2m-r)} \quad r = 2 \rightarrow 2m-1$$

and $$g_{2m}g_{2m+1} = \frac{1}{m}.$$

18. An amplifier according to claim 17, wherein (m−1) represents the predetermined number of odd harmonics which are presented with an open circuit.

19. An amplifier according to claim 18, wherein the value of the load is selected such that the normalised amplitude of the fundamental signal frequency in the amplification means is:

$$A_1 = \frac{2}{(m+1)}\cot\left[\frac{\pi}{2(m+1)}\right]$$

thereby allowing the amplifier to operate at an efficiency of:

$$\eta = \frac{\pi}{2(m+1)}\cot\left[\frac{\pi}{2(m+1)}\right].$$

20. An amplifier according to claim 19, wherein the value of the load is determined from:

$$Z = \frac{2(V_{DC}A_1)}{I_{MAX}}, \quad R_L = \frac{Z_o^2}{Z}, \quad Z_o = \frac{1}{(2m-1)}.$$

21. An amplifier according to claim 20, wherein the value of the load is adjusted, to correct for reactive components generated by coupling between higher ordered harmonics of the signal frequency.

22. An amplifier according to claim 21, wherein the adjustment is made by monitoring the drain source voltage of the amplifier, and observing characteristic peaks of the drain source voltage.

23. An amplifier according to claim 21, wherein the adjustment is determined from:

$$Z = \frac{2V_{dc}}{I_{max}}(A_1 + jX_m),$$

$$X_m = \frac{I_{max}}{\pi V_{dc}} \sum_{n=m}^{\infty} \frac{X(2n)}{(4n^2-1)} \frac{2n}{(m+1)}\left[\cot\left[\frac{(2n-1)\pi}{2(m+1)}\right] - \cot\left[\frac{(2n+1)\pi}{2(m+1)}\right]\right].$$

24. An amplifier according to claim 18, wherein the filter comprises a shunt resonator tuned to the signal frequency.

25. An amplifier according to claim 24, wherein the shunt resonator is detuned from the signal frequency, to correct for reactive components generated by coupling between higher ordered harmonics of the signal frequency.

26. An amplifier according to claim 25, wherein the adjustment is made by monitoring the drain source voltage of the amplifier, and observing characteristic peaks of the drain source voltage.

27. An amplifier according to claim 25, wherein the adjustment is determined from:

$$Z = \frac{2V_{dc}}{I_{max}}(A_1 + jX_m),$$

$$X_m = \frac{I_{max}}{\pi V_{dc}} \sum_{n=m}^{\infty} \frac{X(2n)}{(4n^2-1)} \frac{2n}{(m+1)}\left[\cot\left[\frac{(2n-1)\pi}{2(m+1)}\right] - \cot\left[\frac{(2n+1)\pi}{2(m+1)}\right]\right].$$

28. An amplifier according to claim 18, wherein the normalised values of the capacitors and inductors are converted to real values by multiplying them by the value of the inherent drain source capacitance of the field effect transistor.

29. An amplifier according to claim 18, wherein the terminating network further comprises an output impedance tuner.

30. An amplifier according to claim 18, wherein the amplifier further comprises of inductors and capacitors arranged to provide input impedance matching at an input of the field effect transistor.

31. An amplifier according to claim 18, wherein the inductors of the terminating network are formed from bonded wires.

32. An amplifier according to claim 18, wherein the terminating network is formed from Low Temperature Co-Fired Ceramics (LTCC).

33. An amplifier according to claim 18, wherein the field effect transistor comprises a pseudomorphic high electron mobility transistor.

* * * * *